United States Patent
Taguchi et al.

(10) Patent No.: US 11,885,003 B2
(45) Date of Patent: Jan. 30, 2024

(54) ROTATIONAL DRIVE DEVICE, SUBSTRATE PROCESSING APPARATUS, AND ROTATIONAL DRIVING METHOD

(71) Applicant: Tokyo Electron Limited, Tokyo (JP)

(72) Inventors: Junnosuke Taguchi, Iwate (JP); Yasutomo Kimura, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 30 days.

(21) Appl. No.: 17/110,719

(22) Filed: Dec. 3, 2020

(65) Prior Publication Data
US 2021/0180187 A1   Jun. 17, 2021

(30) Foreign Application Priority Data
Dec. 11, 2019 (JP) ................... 2019-223713

(51) Int. Cl.
*C23C 16/458* (2006.01)
*H01L 21/67* (2006.01)
*C23C 16/455* (2006.01)

(52) U.S. Cl.
CPC .... *C23C 16/4584* (2013.01); *H01L 21/67259* (2013.01); *C23C 16/45544* (2013.01)

(58) Field of Classification Search
CPC ....... C23C 16/45525; C23C 16/45536–45544; C23C 16/45551; C23C 16/458; C23C 16/4583–4586; H01J 37/32082–321; H01J 37/32513; H01J 37/32568; H01J 37/32577; H01J 37/32715; H01J 37/32733–32779; H01L 21/67069; H01L 21/677–67715; H01L 21/68764; H01L 21/68771; H01L 21/68785; H01L 21/68792
See application file for complete search history.

(56) References Cited

U.S. PATENT DOCUMENTS

| 4,858,556 A | * | 8/1989 | Siebert | C23C 14/546 |
| | | | | 219/209 |
| 5,562,947 A | * | 10/1996 | White | C23C 16/46 |
| | | | | 118/728 |
| 5,795,448 A | * | 8/1998 | Hurwitt | C23C 14/505 |
| | | | | 204/192.12 |
| 5,980,706 A | * | 11/1999 | Bleck | H01L 21/68728 |
| | | | | 204/297.08 |
| 6,183,615 B1 | * | 2/2001 | Yasar | H01L 21/67709 |
| | | | | 204/192.12 |
| 6,395,093 B1 | * | 5/2002 | Ayers | C23C 14/505 |
| | | | | 318/16 |

(Continued)

FOREIGN PATENT DOCUMENTS

JP 2016-092156 A 5/2016

*Primary Examiner* — Benjamin Kendall
*Assistant Examiner* — Kurt Sweely
(74) *Attorney, Agent, or Firm* — Venjuris, P.C.

(57) ABSTRACT

A rotational drive device includes a first rotator configured to rotate with respect to a stator, a plurality of second rotators configured to rotate with respect to the first rotator, a plurality of drivers configured to rotatably drive the respective second rotators, and a plurality of driver controllers configured to rotate integrally with the first rotator and to control rotation of the drivers, respectively, the respective driver controllers being connected to one another by a communication network.

10 Claims, 6 Drawing Sheets

(56) References Cited

U.S. PATENT DOCUMENTS

| | | | | |
|---|---|---|---|---|
| 6,837,940 B2* | 1/2005 | Komeno | ............ | H01L 21/68785 |
| | | | | 156/345.55 |
| 2007/0098895 A1* | 5/2007 | Smith | .................... | C23C 14/505 |
| | | | | 427/255.7 |
| 2008/0102199 A1* | 5/2008 | Gurary | .............. | H01L 21/68764 |
| | | | | 118/52 |
| 2010/0136795 A1* | 6/2010 | Honma | ............. | H01L 21/68764 |
| | | | | 438/758 |
| 2011/0083602 A1* | 4/2011 | Bergmann | ........ | H01L 21/68764 |
| | | | | 269/57 |
| 2013/0071218 A1* | 3/2013 | Hosek | ............... | H01L 21/67259 |
| | | | | 414/744.5 |
| 2016/0177450 A1* | 6/2016 | Kanno | .................... | C23C 16/46 |
| | | | | 427/535 |
| 2018/0251892 A1* | 9/2018 | Kobayashi | .......... | C23C 16/4584 |

* cited by examiner

ROTATIONAL DRIVE DEVICE, SUBSTRATE PROCESSING APPARATUS, AND ROTATIONAL DRIVING METHOD

CROSS-REFERENCE TO RELATED APPLICATION

This application is based on and claims priority from Japanese Patent Application No. 2019-223713 filed on Dec. 11, 2019 with the Japan Patent Office, the disclosure of which is incorporated herein in its entirety by reference.

TECHNICAL FIELD

The present disclosure relates to a rotational drive device, a substrate processing apparatus, and a rotational driving method.

BACKGROUND

There has been known a film forming apparatus in which a rotary table accommodating a plurality of wafers is rotated to revolve each wafer so that the wafers repeatedly passes through a processing gas supply area which is arranged to follow the radial direction of the rotary table, thereby forming various films on the wafers (see, e.g., Japanese Patent Laid-open Publication No. 2016-092156). In this apparatus, during the revolution of the wafers by the rotary table, a stage for each wafer is rotated to rotate the wafer on its axis, which contributes to the uniformity of the film in the circumferential direction of the wafer.

SUMMARY

A rotational drive device according to an aspect of the present disclosure includes a first rotator configured to rotate with respect to a stator, a plurality of second rotators configured to rotate with respect to the first rotator, a plurality of second drive units configured to rotatably drive the plurality of second rotators, respectively, and a plurality of drivers configured to rotate integrally with the first rotator and to control rotation of the second drive units, respectively, and each connected to one another by a communication network.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the attached drawings, the same or corresponding members or parts will be designated by the same or corresponding reference numerals, and a duplicate description thereof will be omitted.

Substrate Processing Apparatus

Figure 1:
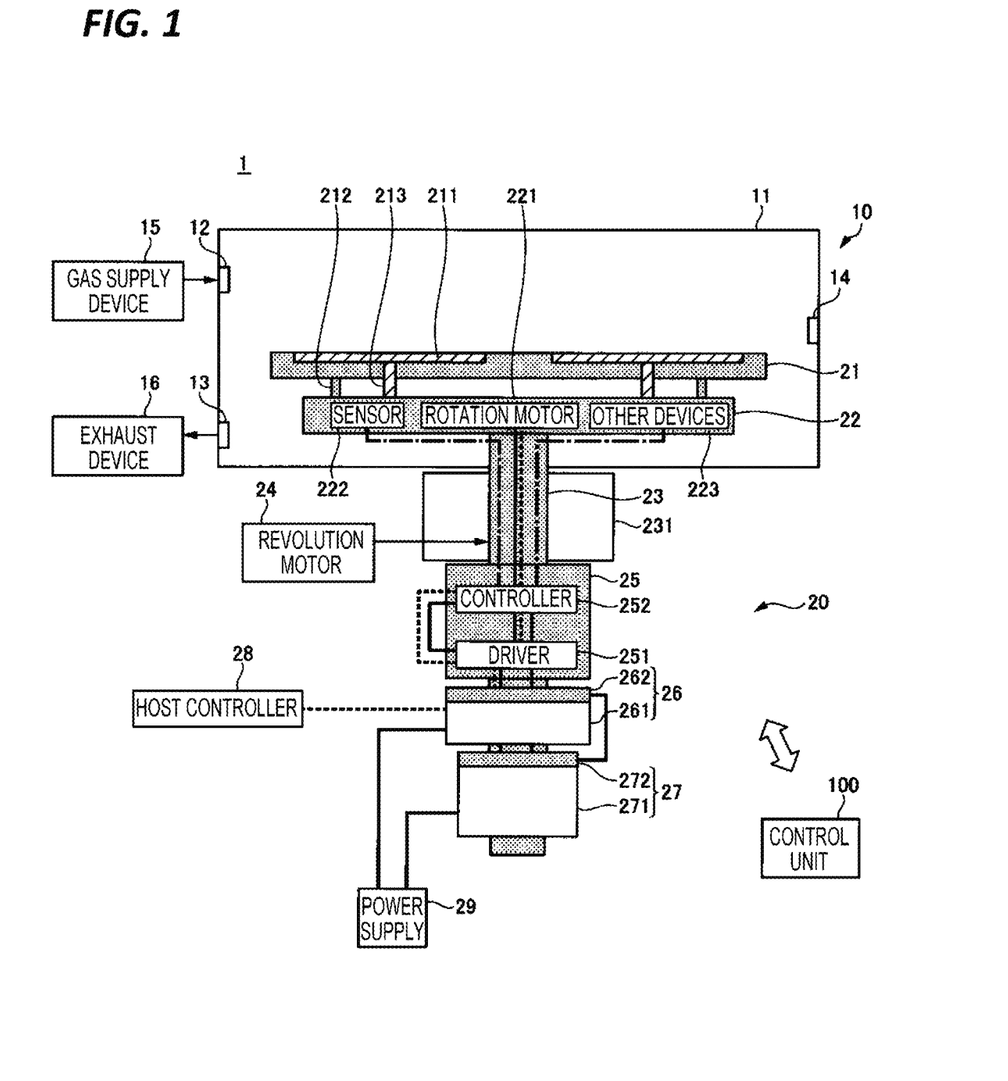
FIG. 1 is a view illustrating a configuration example of a substrate processing apparatus.
Figure 2:
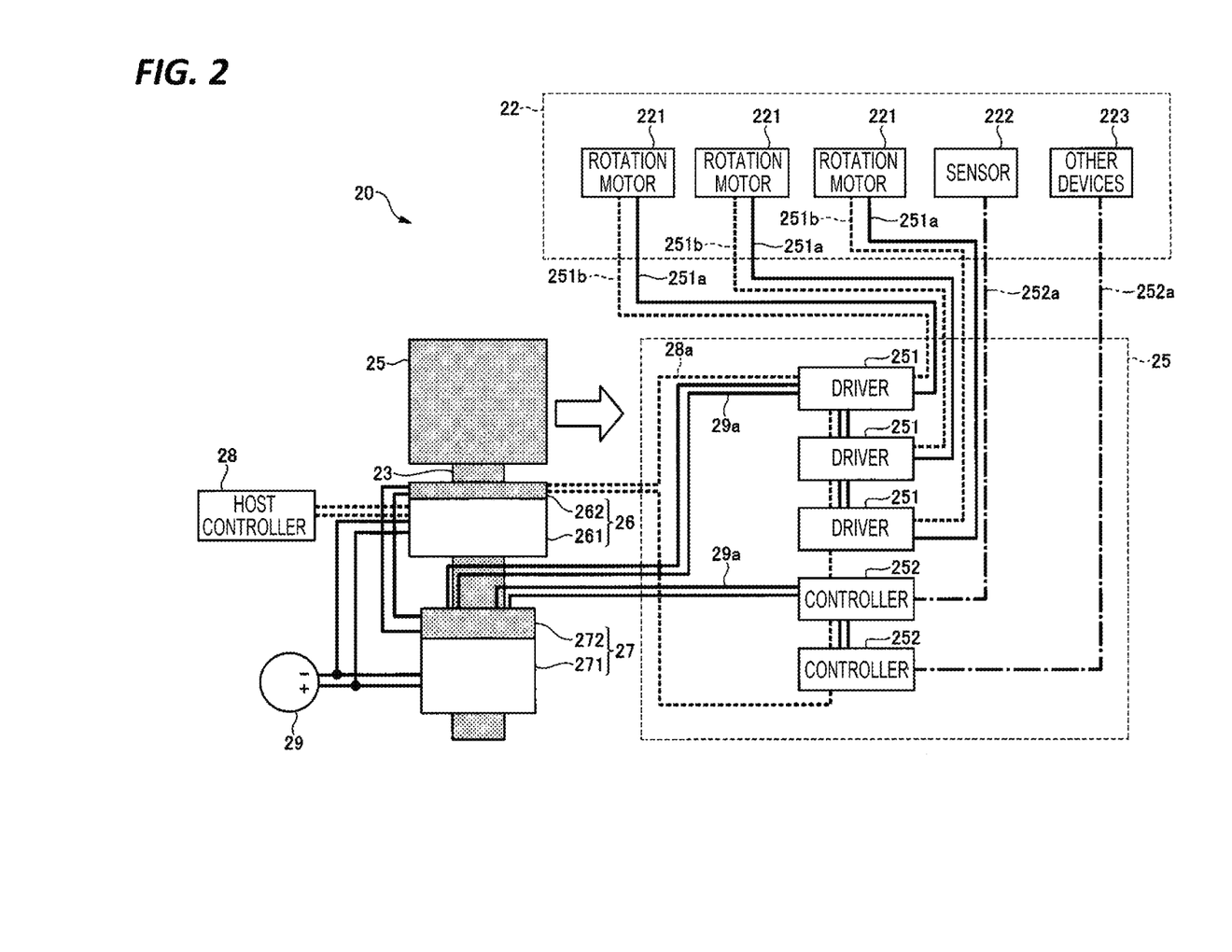
FIG. 2 is a view illustrating a configuration example of a rotational drive device.

A configuration example of a substrate processing apparatus will be described with reference to FIGS. 1 and 2. FIG. 1 is a view illustrating a configuration example of a substrate processing apparatus. FIG. 2 is a view illustrating a configuration example of a rotational drive device. In FIGS. 1 and 2, a stator is represented in white, a first rotator which rotates with respect to the stator is represented by dots, and a second rotator which rotates with respect to the first rotator is represented by diagonal lines. Further, in FIGS. 1 and 2, a line which transmits electric power is represented by a solid line, a line which transmits a signal is represented by a dashed line, and other lines are illustrated by a one dot chain line.

The substrate processing apparatus 1 includes a processor 10, a rotational drive device 20, and a control unit 100.

The processor 10 is configured to execute a semiconductor manufacturing process on a substrate. The semiconductor manufacturing process includes, for example, a heat processing, a film forming processing, and an etching processing. The processor 10 includes a vacuum container 11, a gas introduction port 12, a gas exhaust port 13, and a transfer port 14.

The vacuum container 11 is a container capable of decompressing the inside thereof. The vacuum container 11 is configured to be able to accommodate a plurality of substrates therein. However, the vacuum container 11 may be configured to be able to accommodate one substrate therein. The substrate may be, for example, a semiconductor wafer.

The gas introduction port 12 is provided in the vacuum container 11. The gas introduction port 12 may be, for example, a gas nozzle or a shower head. A gas is introduced from a gas supply device 15 into the vacuum container 11 through the gas introduction port 12 to for execute the semiconductor manufacturing process. The gas includes, for example, at least one of a film forming gas, an etching gas, and a purge gas.

The gas exhaust port 13 is provided in the vacuum container 11. The gas exhaust port 13 may be, for example, an opening formed in the wall surface of the vacuum container 11. The gas introduced into the vacuum container 11 is exhausted by an exhaust device 16 through the gas exhaust port 13.

The transfer port 14 is provided in the vacuum container 11. The transfer port 14 is an opening for carrying the substrate into the vacuum container 11 or carrying out the substrate from the inside of the vacuum container 11. The transfer port 14 is opened and closed by a gate valve (not illustrated).

The gas supply device 15 introduces the gas for the execution of the semiconductor manufacturing process into the vacuum container 11 through the gas introduction port 12. The gas supply device 15 includes, for example, a gas supply source, a gas pipe, a valve, and a flow rate controller.

The exhaust device 16 exhausts the gas introduced in the vacuum container 11, and depressurizes the inside of the vacuum container 11. The exhaust device 16 includes, for example, an exhaust pipe, a valve, and a vacuum pump.

The rotational drive device 20 includes a rotary table 21, a motor box 22, a rotating shaft 23, a revolution motor 24, a driver box 25, a slip ring 26, a slip ring 27, a host controller 28, and a power supply 29.

The rotary table 21 is provided in the vacuum container 11. The rotary table 21 is configured to be rotatable around the center of the vacuum container 11 as a rotation axis. The rotary table 21 has, for example, a disk shape. A plurality of stages 211 are provided on the upper surface of the rotary table 21 in the rotation direction (circumferential direction). A substrate is placed on each stage 211. Each stage 211 configures a second rotator which rotates with respect to the rotary table 21.

The motor box 22 is provided in the vacuum container 11. The motor box 22 is connected to the rotary table 21 via a connector 212, and is configured to be rotatable integrally with the rotary table 21. The inside of the motor box 22 is isolated from the inside of the vacuum container 11, and is maintained at, for example, an atmospheric pressure. A rotation motor 221, a sensor 222, and any other devices 223 are accommodated in the motor box 22.

The rotation motor 221 rotates the substrate by rotating the stage 211 with respect to the rotary table 21 via a rotation shaft 213. The same number of rotation motors 221 as the stages 211 are provided. The rotation motor 221 may be, for example, a servo motor. The sensor 222 includes, for example, a temperature sensor. The other devices 223 include, for example, an accelerometer.

The rotating shaft 23 is fixed to the motor box 22. However, the rotating shaft 23 may be fixed to the rotary table 21. The rotating shaft 23 is provided so as to penetrate the bottom of the vacuum container 11. A magnetic fluid seal 231 is provided to a through-portion of the bottom of the vacuum container 11 to maintain an airtight condition inside the vacuum container 11.

The revolution motor 24 revolves the substrate by rotating the rotary table 21 with respect to the vacuum container 11 via the rotating shaft 23. Further, when the rotating shaft 23 rotates, the motor box 22 and the driver box 25 rotate integrally with the rotary table 21. That is, the rotary table 21, the motor box 22, the rotating shaft 23, and the driver box 25 configure a first rotator which rotates integrally.

The driver box 25 is fixed to the rotating shaft 23. Thus, the driver box 25 rotates integrally with the rotating shaft 23. The driver box 25 is a housing in which a plurality of drivers 251 and a plurality of controllers 252 are accommodated. In addition, FIG. 1 illustrates only one driver 251 and one controller 252.

The driver 251 is connected to the host controller 28 via the slip ring 26 and a signal line 28a, and is connected to the power supply 29 via the slip ring 27 and a power line 29a. Further, the driver 251 is connected to the rotation motor 221 via a power cable 251a and an encoder cable 251b. The driver 251 drives the rotation motor 221 so as to follow a command from the host controller 28.

The controller 252 is connected to the host controller 28 via the slip ring 26 and the signal line 28a, and is connected to the power supply 29 via the slip ring 27 and the power line 29a. Further, the controller 252 is connected to the sensor 222 or the other devices 223 via a cable 252a, and controls the sensor 222 or the other devices 223 so as to follow a command from the host controller 28. The cable 252a includes, for example, a power cable and a signal cable.

The drivers 251, the controllers 252, and the host controller 28 are connected to one another by a communication network (e.g., a wired network). In the present embodiment, the drivers 251, the controllers 252, and the host controller 28 are connected to one another by a daisy chain via a field network. The field network may be, for example, EtherCAT (registered trademark). Further, the connection form of the drivers 251 and the controllers 252 may be, for example, a ring form.

Figure 3:
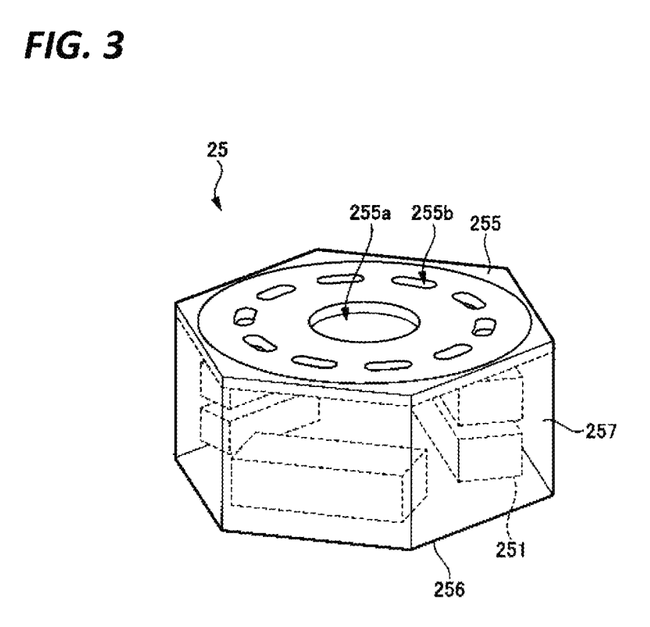
FIG. 3 is a view illustrating a configuration example of a driver box.

FIG. 3 is a view illustrating a configuration example of the driver box 25. The driver box 25 has the shape of a hexagonal column. However, the shape of the driver box 25 is not limited to this, and may be, for example, a cylindrical shape. The driver box 25 includes a top plate 255, a bottom plate 256, and six side plates 257.

The top plate 255 has a hexagonal shape, and constitutes the upper bottom surface of the hexagonal column. A through-hole 255a and a through-hole 255b are formed in the top plate 255. The through-hole 255a is a hole through which the rotating shaft 23 is inserted, and is formed in the center of the top plate 255. The through-hole 255b is a hole through which the power cable 251a, the encoder cable 251b, or the cable 252a is inserted. A plurality of through-holes 255b are evenly arranged in the circumferential direction. The number of through-holes 255b may be the same as, for example, the number of drivers 251 (the number of rotation motors 221).

Similarly to the top plate 255, the bottom plate 256 has a hexagonal shape, and constitutes the lower bottom surface of the hexagonal column. A through-hole (not illustrated) is formed in the bottom plate 256. The signal line 28a or the power line 29a is inserted through the through-hole.

The side plates 257 have a rectangular shape. The side plates 257 connect the top plate 255 and the bottom plate 256 to each other, and constitute the side surfaces of the hexagonal column.

Referring back to FIG. 2, the slip ring 26 is provided below the driver box 25. The slip ring 26 includes a fixed portion 261 and a rotating portion 262, and is configured to transmit a signal output from the host controller 28 from the fixed portion 261 to the rotating portion 262, and transmit the signal to the driver 251 and the controller 252 in the driver box 25. The slip ring 26 may be, for example, a non-contact type slip ring. Thus, the quality of communication is improved, and maintainability is improved. Examples of the non-contact type slip ring may include a slip ring using a capacitive coupling technique. However, the slip ring 26 may be, for example, a contact type slip ring or a rotary connector.

The slip ring 27 is provided below the slip ring 26. The slip ring 27 includes a fixed portion 271 and a rotating portion 272, and is configured to transmit electric power output from the power supply 29 from the fixed portion 271 to the rotating portion 272, and transmit the electric power to the driver 251 and the controller 252 in the driver box 25. The slip ring 27 may be, for example, a non-contact type slip ring. Thus, the quality of communication is improved, and maintainability is improved. Examples of the non-contact type slip ring may include a slip ring using an electromagnetic induction technique. However, the slip ring 27 may be, for example, a contact type slip ring or a rotary connector.

The host controller 28 transmits a signal into the driver box 25 via the slip ring 26 and the signal line 28a. The signal includes an operation command for the rotation motor 221, the sensor 222, and the other devices 223. The signal transmitted into the driver box 25 is transmitted to the drivers 251 and the controllers 252 connected to one another by the communication network.

The power supply 29 transmits electric power to the fixed portion 261 of the slip ring 26. Further, the power supply 29 transmits electric power to the rotating portion 262 of the slip ring 26 via the slip ring 27. Further, the power supply 29 transmits electric power into the driver box 25 via the slip ring 27 and the power line 29a. The electric power transmitted into the driver box 25 is distributed in the driver box 25 so as to be supplied to each of the drivers 251 and each of the controllers 252. This distribution of the electric power in the driver box 25 may reduce the number of lines of the slip ring 27. The power supply 29 may be, for example, a DC24V power supply.

The control unit 100 controls each component of the substrate processing apparatus 1. The control unit 100 may be, for example, a computer. Further, a computer program which takes charge of an operation of each component of the substrate processing apparatus 1 is stored in a storage medium. The storage medium may be, for example, a flexible disk, a compact disk, a hard disk, a flash memory, or a DVD.

As described above, the rotational drive device 20 includes the drivers 251 which rotate integrally with the rotary table 21 and control the rotation of the respective rotation motors 221, and the respective drivers 251 are connected to one another by the communication network. Thus, the number of signal lines 28a which transmit a signal between the host controller 28 and the driver box 25 may be reduced to, for example, 1/(the number of drivers 251). Therefore, it is possible to suppress a communication failure due to crosstalk caused by the complexity of the signal lines 28a. Further, since the number of contacts between the stator and the first rotator is reduced, communication stability is improved.

Further, in the rotational drive device 20, the transmission of a signal between the host controller 28 and the drivers 251 is realized via the non-contact slip ring. Thus, communication stability is ensured, and maintainability is improved.

Further, in the rotational drive device 20, the electric power from the power supply 29 is transmitted into the driver box 25 (rotator) via the non-contact type slip ring, and is distributed in the rotator and supplied to the drivers 251. Thus, the number of power lines 29a which transmit electric power between the power supply 29 and the driver box 25 may be reduced to, for example, 1/(the number of drivers 251). Therefore, it is possible to suppress a communication failure due to crosstalk caused by the complexity of the power lines 29a. Further, since the number of contacts between the stator and the first rotator is reduced, communication stability is improved.

Figure 4:
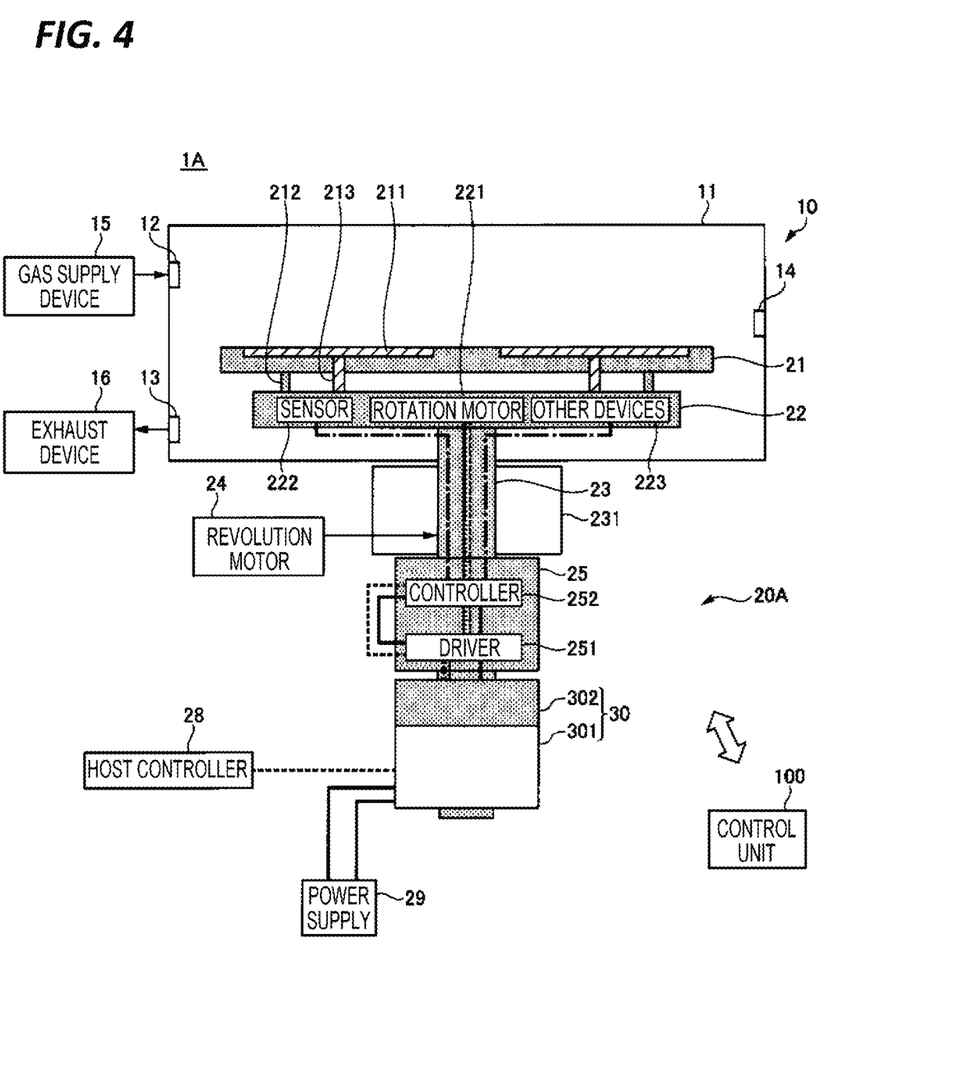
FIG. 4 is a view illustrating another configuration example of a substrate processing apparatus.
Figure 5:
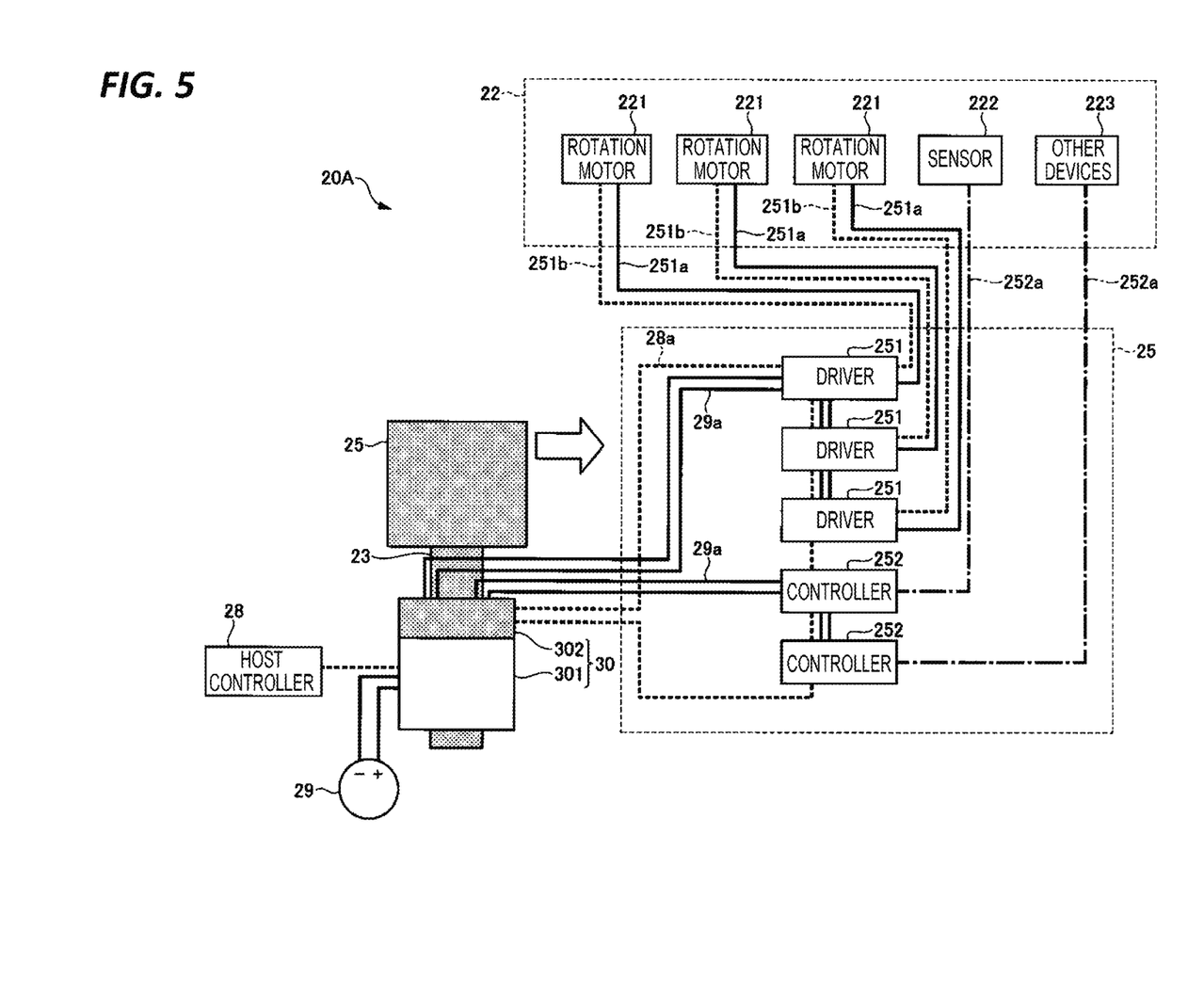
FIG. 5 is a view illustrating another configuration example of a rotational drive device.

Another configuration example of a substrate processing apparatus will be described with reference to FIGS. 4 and 5. FIG. 4 is a view illustrating another configuration example of a substrate processing apparatus. FIG. 5 is a view illustrating another configuration example of a rotational drive device. In FIGS. 4 and 5, a stator is represented in white, a first rotator which rotates with respect to the stator is represented by dots, and a second rotator which rotates with respect to the first rotator is represented by diagonal lines.

Further, in FIGS. 4 and 5, a line which transmits electric power is represented by a solid line, a wire which transmits a signal is represented by a dashed line, and other wires are represented by a one dot chain line.

As illustrated in FIG. 4, the substrate processing apparatus 1A differs from the substrate processing device 1 described above in that one slip ring 30 transmits a signal and electric power between the stator and the first rotator. In addition, the others of the substrate processing apparatus 1A are the same as those of the substrate processing apparatus 1 described above and thus, the differences from the substrate processing apparatus 1 will be mainly described below.

The substrate processing apparatus 1A includes the processor 10 and a rotational drive device 20A.

The rotational drive device 20A includes the rotary table 21, the motor box 22, the rotating shaft 23, the revolution motor 24, the driver box 25, the slip ring 30, the host controller 28, and the power supply 29.

The slip ring 30 is provided below the driver box 25. The slip ring 30 includes a fixed portion 301 and a rotating portion 302, and is configured to transmit a signal output from the host controller 28 and electric power output from the power supply 29 from the fixed portion 301 to the rotating portion 302, and transmit the signal and the electric power to the driver 251 and the controller 252 in the driver box 25. The slip ring 30 may be, for example, a non-contact type slip ring. Thus, the quality of communication is improved, and maintainability is improved. However, the slip ring 30 may be, for example, a contact type slip ring or a rotary connector.

In the substrate processing apparatus 1A illustrated in FIGS. 4 and 5, since the signal and the electric power may be transmitted from the stator to the first rotator by one slip ring 30, the simplified structure is achieved, which may significantly reduce the number of signal lines 28a and the number of power lines 29a.

Operation of Rotational Drive Device

Figure 6:
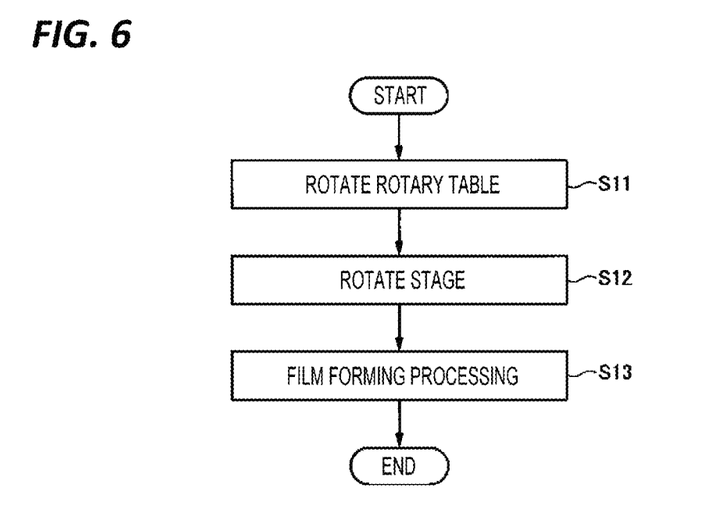
FIG. 6 is a flowchart illustrating an example of an operation of the rotational drive device.

An example of an operation (rotational driving method) of the rotational drive devices 20 and 20A will be described with reference to FIG. 6. FIG. 6 is a flowchart illustrating an example of an operation of the rotational drive devices 20 and 20A.

In the following, a case where a film by atomic layer deposition (ALD) is formed on a substrate placed on the stage 211 in a state where the control unit 100 controls the rotational drive devices 20 and 20A to rotate the rotary table 21 and the stage 211 will be described as an example. The rotational driving method illustrated in FIG. 6 includes steps S11 to S13.

In step S11, the control unit 100 controls the revolution motor 24 to rotate the rotary table 21. Thus, substrates on the stages 211 provided in the circumferential direction of the rotary table 21 revolve. The rotation speed of the rotary table 21 may be, for example, 100 to 500 rpm.

In step S12, the control unit 100 controls the rotation motor 221 to rotate each of the stages 211 provided in the circumferential direction of the rotary table 21 with respect to the rotary table 21. Thus, the substrate placed on each stage 211 rotates on its axis. The rotation speed of the stage 211 may be, for example, 1 to 30 rpm.

In step S13, the control unit 100 controls the processor 10 to execute a film forming processing on the substrate. The control unit 100 supplies a raw material gas and a reaction gas to a raw material gas supply area and a reaction gas supply area, respectively, which are arranged in the radial direction of the rotary table 21 on which the substrates are placed. Thus, once the substrate placed on the stage 211 of the rotary table 21 has repeatedly passed through the raw material gas supply area and the reaction gas supply area, a film by ALD is deposited on the surface of the substrate.

According to the above rotational driving method, the film by ALD is formed on the surface of the substrate by causing the substrate placed on each stage 211 to repeatedly pass through the raw material gas supply area and the reaction gas supply area while rotating the substrate on its axis. Thus, the uniformity of the film in the circumferential direction of the substrate is improved.

Figure 7:
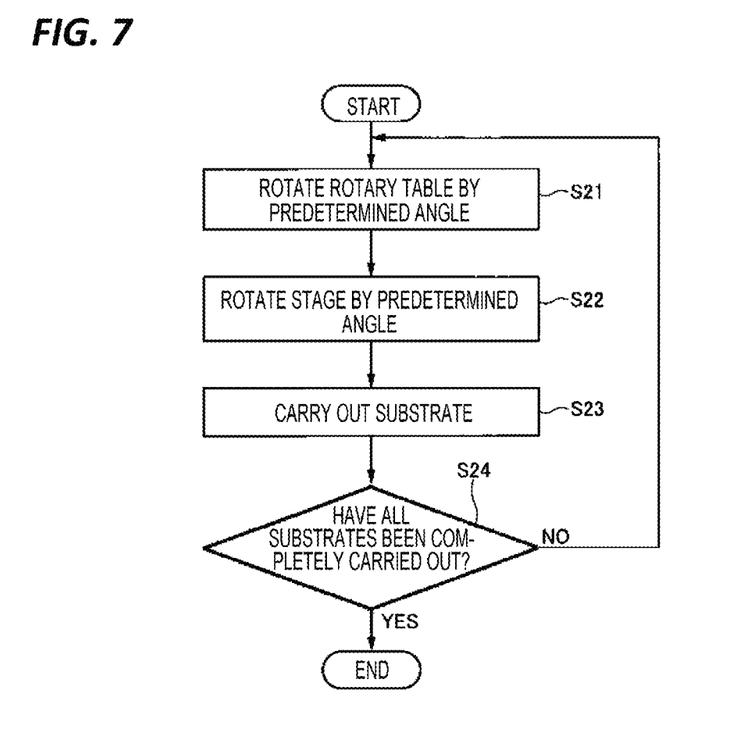
FIG. 7 is a flowchart illustrating another example of an operation of the rotational drive device.

Another example of an operation (rotational driving method) of the rotational driving devices 20 and 20A will be described with reference to FIG. 7. FIG. 7 is a flowchart illustrating another example of an operation of the rotational drive devices 20 and 20A.

In the following, an operation of carrying the substrate placed on the stage 211 of the rotary table 21 out of the vacuum container 11 after rotating the rotary table 21 and the stage 211 as the control unit 100 controls the rotational drive devices 20 and 20A will be described as an example. The rotational driving method illustrated in FIG. 7 is executed, for example, after the film forming processing is completed on the substrates placed on the stages 211. The rotational driving method illustrated in FIG. 7 includes steps S21 to S24.

In step S21, the control unit 100 controls the revolution motor 24 to rotate the rotary table 21 by a predetermined angle so that one of the stages 211 moves to a position facing the transfer port 14.

In step S22, the control unit 100 controls the rotation motor 221 to rotate the stage 211 that has moved to the position facing the transfer port 14 so that the substrate placed on the stage 211 rotates on its axis, thereby implementing the positioning of the substrate in the rotation direction.

In step S23, the control unit 100 opens the gate valve, and carries out, through the transfer port 14, the substrate placed on the stage 211 at the position facing the transfer port 14 by a transfer arm from the outside.

In step S24, the control unit 100 determines whether or not all of the substrates placed on the stages 211 have been completely carried out. When it is determined in step S24 that all of the substrates have been completely carried out, the control unit 100 ends the processing. Meanwhile, when it is determined in step S24 that all of the substrates have not been completely carried out, the control unit 100 returns the processing to step S21.

According to the above rotational driving method, to carry out the substrate for which the film forming processing has been completed, the rotary table 21 is revolved or the stage 211 is rotated, and thereafter, the substrate placed on the stage 211 of the rotary table 21 is carried out of the vacuum container 11. Thus, the substrate which has been subjected to positioning in the rotation direction may be carried out.

In addition, in the above embodiment, the slip rings 26, 27, and 30 are an example of a transmission unit, the revolution motor 24 is an example of a drive unit, and the rotation motor 221 is an example of a second drive unit.

In the above embodiment, a case where the rotary table 21 is provided with five stages 211 has been described, but the present disclosure is not limited to this. For example, the number of stages 211 may be four or less, or six or more.

In the above embodiment, a case where the processor 10 has the vacuum container 11, the gas introduction port 12, the gas exhaust port 13, and the transfer port 14 has been described, but the present disclosure is not limited to this. For example, the processor 10 may further have a plasma generating unit that generates a plasma for activating various gases supplied into the vacuum container 11.

According to the present disclosure, it is possible to suppress a communication failure caused by lines when a drive unit is disposed on a rotator.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processor including a vacuum container that accommodates a substrate therein and configured to perform a processing on the substrate; and
a rotational drive device configured to rotate the substrate in the vacuum container,
wherein the rotational drive device includes:
a first rotator including a rotating shaft, a rotating portion of at least one slip ring, and a housing positioned outside the vacuum container, the first rotator being configured to rotate with respect to the vacuum container and a fixed portion of the at least one slip ring;
a plurality of second rotators configured to rotate with respect to the first rotator;
a plurality of drivers accommodated in a motor box fixed to the rotating shaft and accommodated within the vacuum container, the plurality of drivers being configured to rotatably drive the plurality of second rotators, respectively; and
a plurality of driver controllers accommodated within the housing and configured to control rotation of the plurality of drivers, respectively, and each of the plurality of drivers is connected to one another by a communication network,
the rotating shaft, the rotating portion of the at least one slip ring, the housing having the plurality of driver controllers accommodated therein, and the motor box having the plurality of drivers accommodated therein, all rotate together as the first rotator, and
the rotating shaft extends vertically past a through-hole in an upper surface of the housing.

2. The substrate processing apparatus according to claim 1, wherein the communication network includes a wired network.

3. The substrate processing apparatus according to claim 1, further comprising: a transmitter configured to transmit a signal and electric power between the at least one slip ring and the first rotator.

4. The substrate processing apparatus according to claim 1, wherein the at least one slip ring includes a plurality of slip rings, one slip of the plurality of slip rings being a non-contact type slip ring configured to transmit the signal and another slip ring of the plurality of slip rings being a contact type slip ring configured to transmit the electric power.

5. The substrate processing apparatus according to claim 1, wherein the at least one slip ring includes a non-contact type slip ring configured to transmit the signal and the electric power.

6. The substrate processing apparatus according to claim 1, wherein the electric power is distributed in the housing and is supplied to each of the plurality of driver controllers.

7. The substrate processing apparatus according to claim 1, wherein the signal is supplied to each of the plurality of driver controllers via the communication network.

8. The substrate processing apparatus according to claim 1, wherein the drivers include a servo motor.

9. The substrate processing apparatus according to claim 1, wherein the first rotator further includes a rotary table, and
   wherein the second rotator includes a plurality of stages provided in a circumferential direction of the rotary table and each configured to place a substrate thereon.

10. The substrate processing apparatus according to claim 1, wherein the vacuum container is capable of decompressing an inside thereof and the rotary table is provided in the vacuum container.

\* \* \* \* \*